United States Patent
Ohkubo

(10) Patent No.: US 7,486,017 B2
(45) Date of Patent: Feb. 3, 2009

(54) DISPLAY DEVICE

(75) Inventor: Kazunobu Ohkubo, Kanagawa-ken (JP)

(73) Assignee: FUJIFILM Corporation, Tokyo (JP)

( * ) Notice: Subject to any disclaimer, the term of this patent is extended or adjusted under 35 U.S.C. 154(b) by 662 days.

(21) Appl. No.: 11/073,522

(22) Filed: Mar. 8, 2005

(65) Prior Publication Data

US 2006/0028128 A1 Feb. 9, 2006

(30) Foreign Application Priority Data

Mar. 8, 2004 (JP) ............... 2004-063878

(51) Int. Cl.
*H01J 1/62* (2006.01)
*H01J 63/04* (2006.01)

(52) U.S. Cl. .............. 313/506; 313/509; 313/511; 313/512; 313/483; 313/496; 313/500; 313/504

(58) Field of Classification Search ........... None
See application file for complete search history.

(56) References Cited

U.S. PATENT DOCUMENTS 6,232,050 B1 * 5/2001 Hirai et al. ............ 430/383
6,653,780 B2 11/2003 Sugimoto et al.
2006/0098153 A1 * 5/2006 Slikkerveer et al. ...... 349/187

FOREIGN PATENT DOCUMENTS

JP 4-51494 A 2/1992
JP 2002-18994 A 1/2002
WO WO 2004086530 A1 * 10/2004

* cited by examiner

*Primary Examiner*—Sikha Roy
*Assistant Examiner*—Natalie K Walford
(74) *Attorney, Agent, or Firm*—Sughrue Mion, PLLC

(57) ABSTRACT

A display device includes a substrate, a display portion formed on the substrate, an upper layer which covers the display portion, and a gas barrier layer provided between at least a part of the substrate and the display portion. The gas barrier layer is positioned near to the position which forms a neutral plane when bending moment in a direction in which the substrate is warped acts on the overall display device.

19 Claims, 7 Drawing Sheets

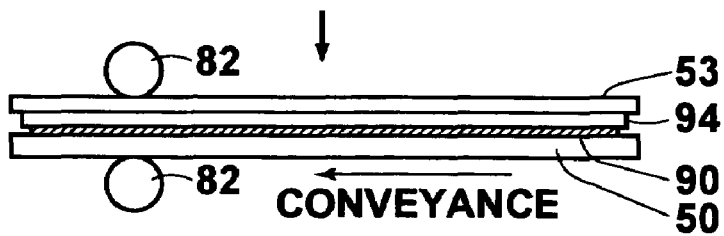
FIG.17A
FIG.17B

DISPLAY DEVICE

BACKGROUND OF THE INVENTION

1. Field of the Invention

This invention relates to a display device, and more particularly to a display device such as an organic EL (electroluminescence) element where a display portion is formed on a substrate.

2. Description of the Related Art

As disclosed, for instance, in Japanese Patent No. 2911552 and Japanese Unexamined Patent Publication No. 2002-18994, there has been known an organic EL element comprising an insulating transparent substrate, a plurality of transparent anodes on the substrate spaced from each other, an organic compound layer which includes at least a light emitting layer and is formed to cover the transparent anodes, and metal cathodes opposed to the transparent anodes intervening therebetween the organic compound layer.

In the organic EL element, the light emitting layer included in the organic compound layer emits light when an electric current flows between the transparent anodes and the metal cathodes, and the light is taken out through the transparent anodes and the transparent substrate. That is, in the organic EL element, each intersection of the transparent anodes and the metal cathodes forms a light emitting portion and light emitting portions can be controlled to emit light (light-emission) and not to emit light (non-light-emission) independently of each other. The organic EL element is excellent in wavelength stability.

In the display device where a display portion is formed on a substrate like an organic EL element, especially, when a resin substrate formed of macromolecular material is used as the substrate, there has been a problem that oxygen or water passing through the substrate can penetrate to the display portion to deteriorate the display portion. In order to deal with the problem, it has been proposed to provide a gas barrier layer between at least a part of the substrate and a display portion as disclosed, for instance, in Japanese Patent No. 2911552 and/or Japanese Unexamined Patent Publication No. 2002-18994. The gas barrier layer is a layer which basically blocks gases but naturally blocks liquids.

Especially in the display device disclosed in Japanese Unexamined Patent Publication No. 2002-18994, it is proposed to provide the gas barrier layer on each of the principal sides of the substrate, thereby reducing the gas-transmittivity of the substrate by increasing the density of the substrate by the compression due to the gas barrier layers.

Further, in the display device disclosed in U.S. Pat. No. 6,653,780, it is proposed to prevent deformation of the resin substrate due to stress of metal electrodes by forming metal film on the resin substrate, which forms auxiliary electrodes, so that the total stress on the metal film does not exceed a predetermined value.

In the display device having a gas barrier layer disclosed in Japanese Unexamined Patent Publication No. 2002-18994, tensile stress is constantly imparted to the gas barrier layer and when the overall device is bent, bending stress is also imparted to the gas barrier layer, which gives to a problem that the gas barrier layer is apt to be damaged.

Further, in the display device having a gas barrier layer disclosed in U.S. Pat. No. 6,653,780, though deformation of the resin substrate due to the stress of the metal electrodes is taken into account, stress when the overall device is bent is not taken into account. Accordingly, a problem that the gas barrier layer is apt to be damaged when the overall device is bent arises.

SUMMARY OF THE INVENTION

In view of the foregoing observations and description, the primary object of the present invention is to provide a display device where even if the device undergoes external force to bend the substrate, the gas barrier layer is not easily damaged.

In accordance with the present invention, by suitably selecting the position of the gas barrier layer, stress acting on the gas barrier layer is made zero or very small when the device undergoes external force to bend the substrate. That is, in accordance with the present invention, there is provided a display device comprising a substrate, a display portion formed on the substrate, an upper layer which covers the display portion, and a gas barrier layer provided between at least a part of the substrate and the display portion, wherein the improvement comprises that the gas barrier layer is positioned near to the position which forms a neutral plane (a plane in which neither tensile stress nor compression stress is generated) when bending moment in a direction in which the substrate is warped acts on the overall display device.

It is preferred that the upper layer be formed by the same material as the substrate.

It is preferred that the distance between the neutral plane and the gas barrier layer be not larger than 30% of the distance between the neutral plane and the surface of the substrate on the side of the gas barrier layer.

In the display device of the present invention, it is further preferred that also the display portion be positioned near to the position which forms a neutral plane. In this case, it is preferred that the distance between the neutral plane and the display portion be not larger than 30% of the distance between the neutral plane and the surface of the substrate on the side of the display portion.

When the display device of the present invention further comprises a second gas barrier layer formed on the side of the display portion opposite to the substrate, it is preferred that the second gas barrier layer is also positioned near to the position which forms a neutral plane.

Further, it is preferred that the present invention be applied to a display device where a resin substrate formed of macromolecular material is used as the substrate.

Further, it is preferred that the present invention be applied to a display device comprising an organic EL element.

In the display device of the present invention, since a gas barrier layer is provided between at least a part of the substrate and the display portion near to the position which forms a neutral plane, no or very small tensile stress or compression stress is generated in the gas barrier layer when the device undergoes external force which warps the substrate, whereby the gas barrier layer is prevented from being damaged.

This point will be described in more detail, hereinbelow. As shown in cross-section in FIG. 1, when a flat plate 1 is bent, tensile stress and compression stress generally act on respectively the outer and inner sides of the flat plate 1. For instance, an organic EL element having a substrate which is bent in this manner will be discussed here. It has been known that the organic EL element is rapidly deteriorated by oxygen and/or water penetrating to the display portion and it is necessary to prevent oxygen and/or water from penetrating to the display portion from the external. Especially, in the case of a flexible substrate, it is essential to provide a gas barrier layer which is impermeable to gas since a plastic substrate high in gas-transmittivity is generally used as the substrate due to necessary flexibility.

When the gas barrier layers 3 and 4 are provided on the surfaces of the substrate 2 as shown in FIG. 2, tensile stress and compression stress are generated respectively on the outer and inner sides of the substrate 2 each time the substrate 2 is bent. Due to these stresses, the dense gas barrier layers 3 and 4 deteriorate, and a defect such as cracks is locally generated to deteriorate the barrier performance of the gas barrier layers 3 and 4 to permit penetration of oxygen and water from the external, thereby promoting deterioration of the organic EL element.

In the neutral plane (a plane where the stress is nullified) inside the substrate, no stress is generated in response to bending of the substrate. Accordingly, when a gas barrier layer 20 is formed near to the neutral plane N as shown in FIG. 3, no stress is generated on the gas barrier layer 20 even if the substrate 10 is bent, and deterioration of the gas barrier layer 20 is prevented. If the modulus of longitudinal elasticity of the substrate 10 is uniform over the entire area thereof, the thicknesses of the substrate 10 above and below the gas barrier layer 20 are substantially equal to each other. In such an arrangement, the display portion 30 may be disposed, for instance, near to the neutral plane N as shown in FIG. 3. In the example shown FIG. 3, the display portion 30 is formed on the lower substrate 10 and the upper substrate 10 is formed of the same material as the lower substrate 10 over the lower substrate 10 as the upper layer which covers the display portion 30. However, the upper layer may be formed of material different from that of the lower substrate 10.

Whereas, when the modulus of longitudinal elasticity of the substrate A disposed above the gas barrier layer 20 is $E_1$ and the modulus of longitudinal elasticity of the substrate B disposed below the gas barrier layer 20 is $E_2$ different from $E_1$ as shown in FIG. 4, the thicknesses $y_1$ and $y_2$ of the substrates A and B are set to satisfy formula $E_1 \cdot y_1^2 = E_2 \cdot y_2^2$ taking into account the balance of the moments. Further, when the modulus of longitudinal elasticity of each of the substrates 10 above and below the gas barrier layer 20 is a function $E(y)$ of the position y in the direction of thickness, the thicknesses $y_1$ and $y_2$ of the respective substrates 10 are determined to satisfy formula $$\int_{y_1}^{y_2} y \cdot E(y) dy = 0 \quad (1)$$

taking into account the balance of the moments shown in FIG. 5.

Though the structure where the gas barrier layer is sandwiched between a pair of substrates has been described, the same is true in the structure where one of the substrates is protective film, for instance, of polymer formed by application. That is, in this case, the protective film forms the upper layer described above. Further, the gas barrier layer may be of a multiple layers. The display portion is abbreviated in FIGS. 4 and 5 and FIG. 6 to be described later.

The case where the gas barrier layer is not in the neutral plane N will be discussed, hereinbelow. Assuming that a gas barrier layer 20 of a thickness of $\Delta y$ is formed in a position shifted inward by the distance t' from the surface of a flexible substrate 10 of a thickness t, the balance of the moments shown in FIG. 6 is expressed as follows from the above formula (1) wherein EB and ES respectively represent the moduli of longitudinal elasticity of the gas barrier layer 20 and the flexible substrate 10, and y1, y2 and y3 respectively represent the position of the surface of the substrate 10 opposite to the gas barrier layer 20 with the neutral plane N taken as the reference, the position of the surface of the substrate 10 on the side of the gas barrier layer 20 with the neutral plane N taken as the reference, and the position of the gas barrier layer 20.

$$\int_{y_3}^{y_3+\Delta y} E_B y \, dy + \int_{y_2}^{y_2} E_S y \, dy = 0$$

When the above formula is calculated with $\Delta y^2$ (very small) abbreviated, the following formula is obtained.

$$2E_1 y_3 \Delta y = E_2 (y_2^2 - y_1^2) \quad (2)$$

Since $t' = y_2 - y_3$ and $t = y_2 - y_1$, $y_3$ is expressed by the following formula.

$$y_3 = E_B t(t - 2t') / \{2(E_B \Delta y + E_S t)\} \quad (3)$$

Further, since the stress σ applied to the gas barrier layer 20 is proportional to the position $y_3$ of the gas barrier layer 20 from the neutral plane N, the following formula can be obtained.

$$\sigma = E_B y_3 / r \quad (4)$$

wherein r represents the radius of curvature of warpage of the substrate.

On the basis of the points described above, concrete values in the case where a gas barrier layer 20 is formed on a general flexible substrate 10 are calculated. It is assumed that dense inorganic film is formed as the gas barrier layer 20 and $E_B$=300 GPa since the modulus of longitudinal elasticity of the inorganic film is about several hundreds of GPa, that the flexible substrate 20 is formed of polymer which is high in flexibility so that the flexible substrate 20 can be bent and $E_S$=300 MPa since the modulus of longitudinal elasticity of the polymer is about several hundreds of MPa. Since the gas barrier layer 20 is thin film and generally not larger than 1 μm in thickness, it is assumed that $\Delta y$=300 nm. Further, it is assumed that the overall thickness t of the flexible substrate 10 is 0.2 mm where the flexibility and the strength are compatible with each other. When the distance t' from the surface of a flexible substrate 10 is 0.05 mm, $y_3$=20 μm from formula (3).

The result obtained by calculating σ–r characteristics by substituting the value in formula (4) is shown in FIG. 7. As can be understood from FIG. 7, as the radius r of curvature of warpage of the substrate is reduced, the stress σ in the gas barrier layer 20 increases. Since the tensile strength of $Al_2O_3$ which is generally used as the gas barrier layer 20 is about 400 MPa, the gas barrier layer 20 is broken when the radius r of curvature of warpage of the substrate is reduced to not larger than 15 mm.

As the distance of the gas barrier layer 20 from the neutral plane N increases, the stress σ acting on the gas barrier layer 20 increases and the limit value approaches. As a coefficient which is obtained by standardizing the distance of the gas barrier layer 20 from the neutral plane N with the distance between the surface of the substrate 10 on the side of the gas barrier layer 20 and the neutral plane N, $\eta(=y_3/y_2)$ is defined. The following formula is derived from formula (3) and $t'=y_2-y_3$.

$$\eta = E_S t(t - 2t') / (E_S t^2 + 2E_B t' \Delta y) \quad (5)$$

Further, when the radius r of curvature is expressed by η, $$r = (EB/\sigma) \cdot t' \eta / (1 - \eta) \quad (6)$$

Accordingly, the relation of the radius r of curvature versus η is derived. The result obtained by calculating the relation between the limit radius of curvature r and η from this result is shown in FIG. 8. (The acceptable stress σ=400 MPa, $E_B$=300 GPa, $E_S$=300 MPa, Δy=300 nm and t=0.2 mm as described above.)

As can be understood from FIG. 8, as η approaches 0, the limit radius of curvature r becomes smaller and the display device can be wound to smaller radius. The limit radius of curvature r is 30 mm when η=1 (when the gas barrier layer is on the surface of the substrate), 15 mm when η=0.3 and 0 when η=0 (when the gas barrier layer is on the neutral plane N).

When η is not larger than 0.3, the limit radius of curvature r is not larger than half of that when the gas barrier layer is on the surface of the substrate and the winding dimension may be suppressed to half of that when the gas barrier layer is on the surface of the substrate. Thus, it is preferred that the gas barrier layer is near to the neutral plane N so that η is not larger than 0.3, that is, the distance between the neutral plane N and the gas barrier layer is not larger than 30% of the distance between the neutral plane and the surface of the substrate on the side of the gas barrier layer.

Though the case where a single gas barrier layer is in a substrate of a uniform thickness has been discussed above, in the case of an arbitrary layer arrangement, the position of the neutral plane N is calculated by substituting the distribution of E(y) in formula (1) and the relation between the value of η and the limit radius of curvature r can be obtained by carrying out a calculation similar to that described above on the basis of the calculated position of the neutral plane N.

In the display device such as an organic EL element, deterioration is promoted also in the display portion by bending stress of the substrate, and the service life of the display device is shortened. Especially, ITO or $SnO_2$ which is used as transparent electrodes in the display portion is relatively apt to be damaged by bending since they are oxide.

When the display portion is disposed near to the neutral plane, no or very small tensile stress or compression stress is generated in the display portion when the device undergoes external force which warps the substrate, whereby the display portion is prevented from being damaged. FIG. 9 shows in brief this arrangement. In FIG. 9, though the neutral plane is abbreviated in order to avoid the complication, it exists near to the gas barrier layer 20 and the display portion 30 which are sandwiched between the upper and lower substrates 10.

Also in this case, it is preferred that the position of the display portion be near to the neutral plane so that the distance between the neutral plane and the display portion is not larger than 30% of the distance between the neutral plane and the surface of the substrate on the side of the display portion for the same reason as discussed above on the position of the gas barrier layer by the use of the value of η.

Further, in the arrangement where a second gas barrier layer 22 is formed on the side of the display portion 30 opposite to the lower substrate 10 (that is, in the upper substrate 10 as the upper layer) as shown in FIG. 10, when the second gas barrier layer 22 is also disposed near to the neutral plane, no or very small tensile stress or compression stress is generated in the second gas barrier layer 22 when the device undergoes external force which warps the substrate, whereby also the second gas barrier layer 22 is prevented from being damaged.

Further, since the resin substrate formed of macromolecule material is especially permeable to oxygen, it is especially useful to apply the present invention to a display device where a resin substrate is employed.

Further, since the organic EL element is rapidly deteriorated by oxygen and/or water which has reached the display portion, the present invention is remarkably useful to prevent deterioration of the organic EL element.

BRIEF DESCRIPTION OF THE DRAWINGS

FIGS. 17A and 17B are views for illustrating a method of producing a display device in accordance with the present invention.

DESCRIPTION OF THE PREFERRED EMBODIMENT

Figure 1:
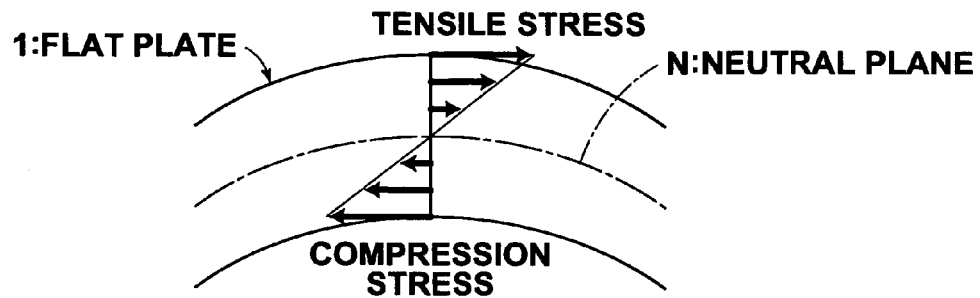
FIG. 1 is a view for illustrating the effect of the present invention.
Figure 2:
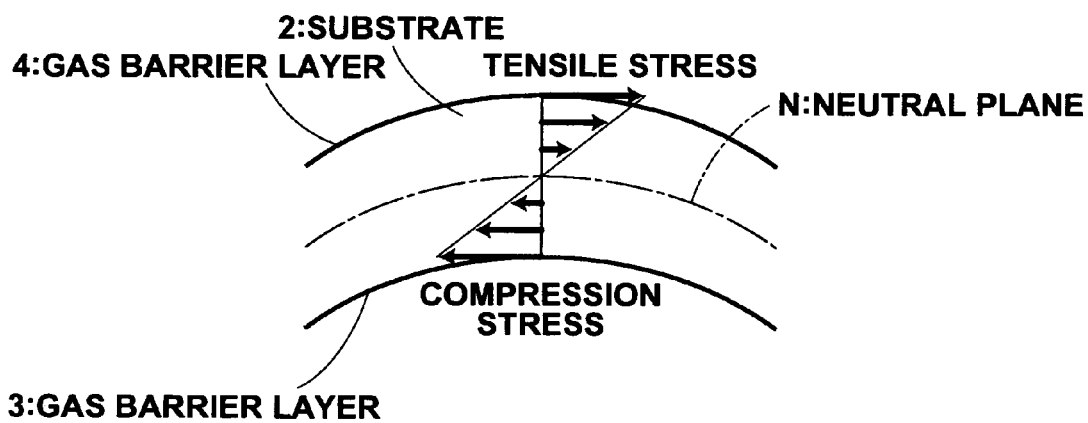
FIG. 2 is a view for illustrating the effect of the present invention.
Figure 3:
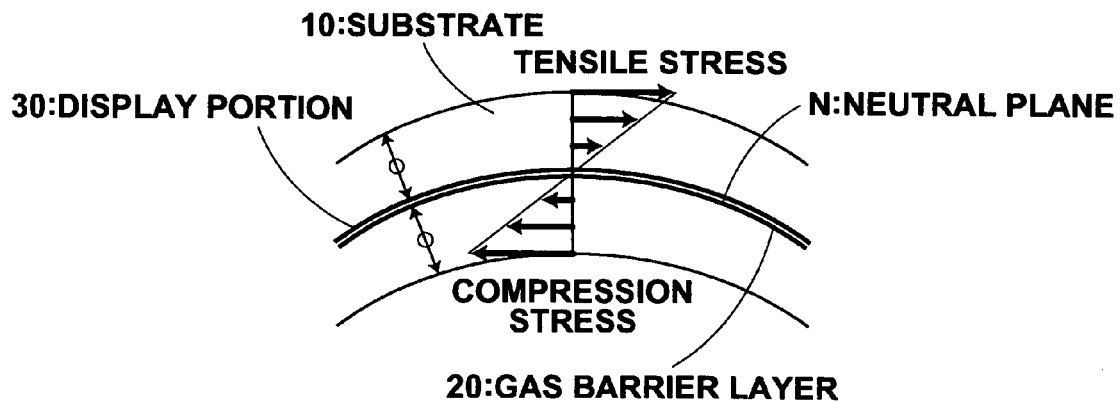
FIG. 3 is a view showing in brief a basic arrangement of the display device of the present invention.
Figure 4:
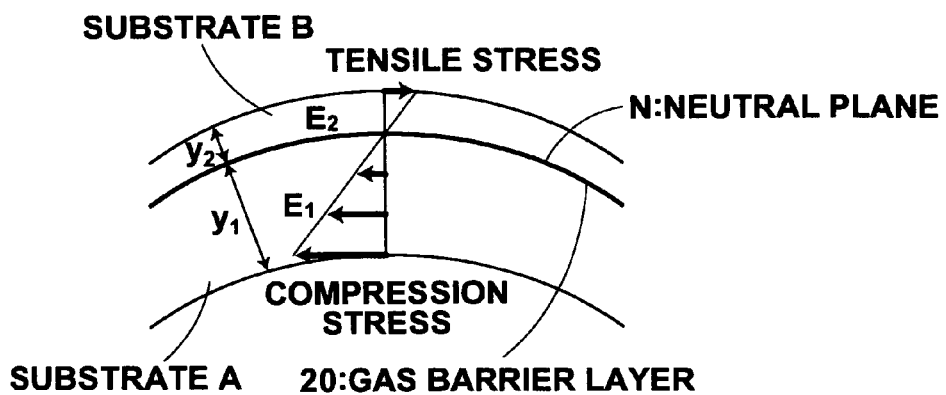
FIG. 4 is a view for illustrating the effect of the present invention.
Figure 5:
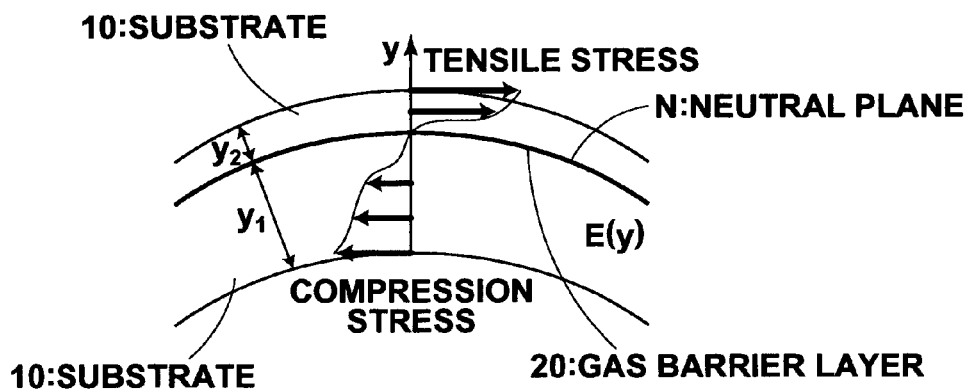
FIG. 5 is a view for illustrating the effect of the present invention.
Figure 6:
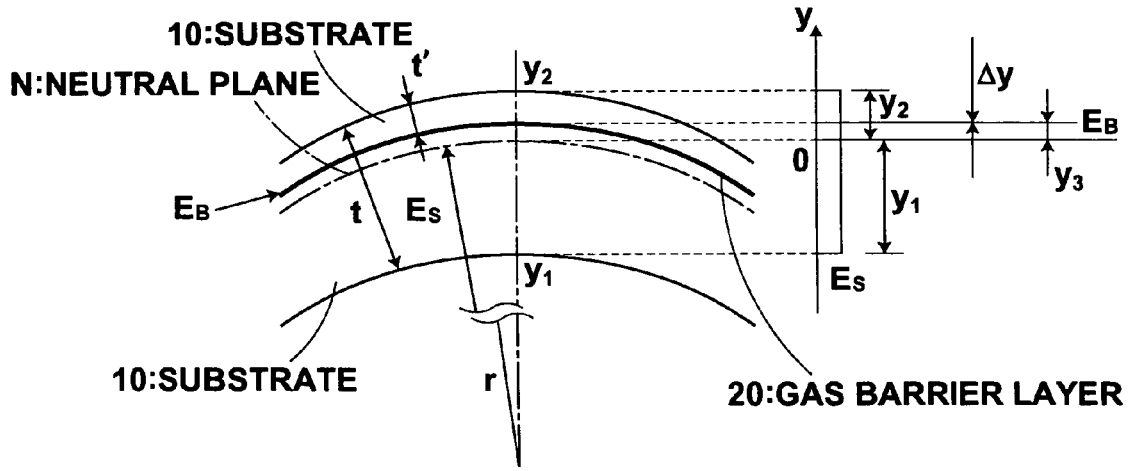
FIG. 6 is a view for illustrating the effect of the present invention.
Figure 7:
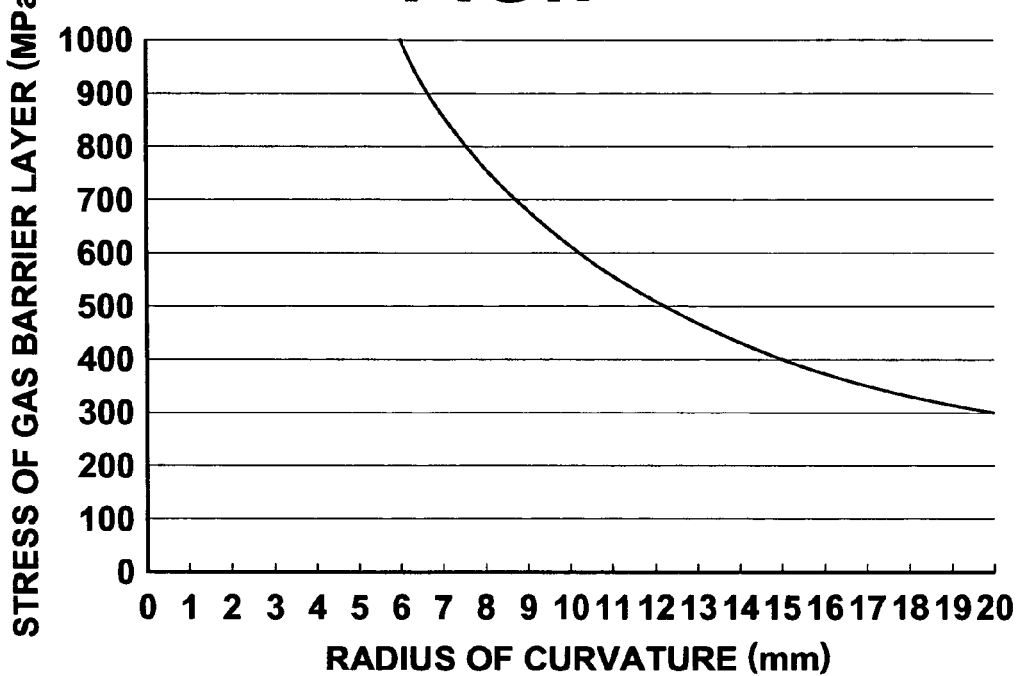
FIG. 7 is a graph showing the relation between the radius of curvature of the substrate and the stress acting on the gas barrier layer in the display device.
Figure 8:
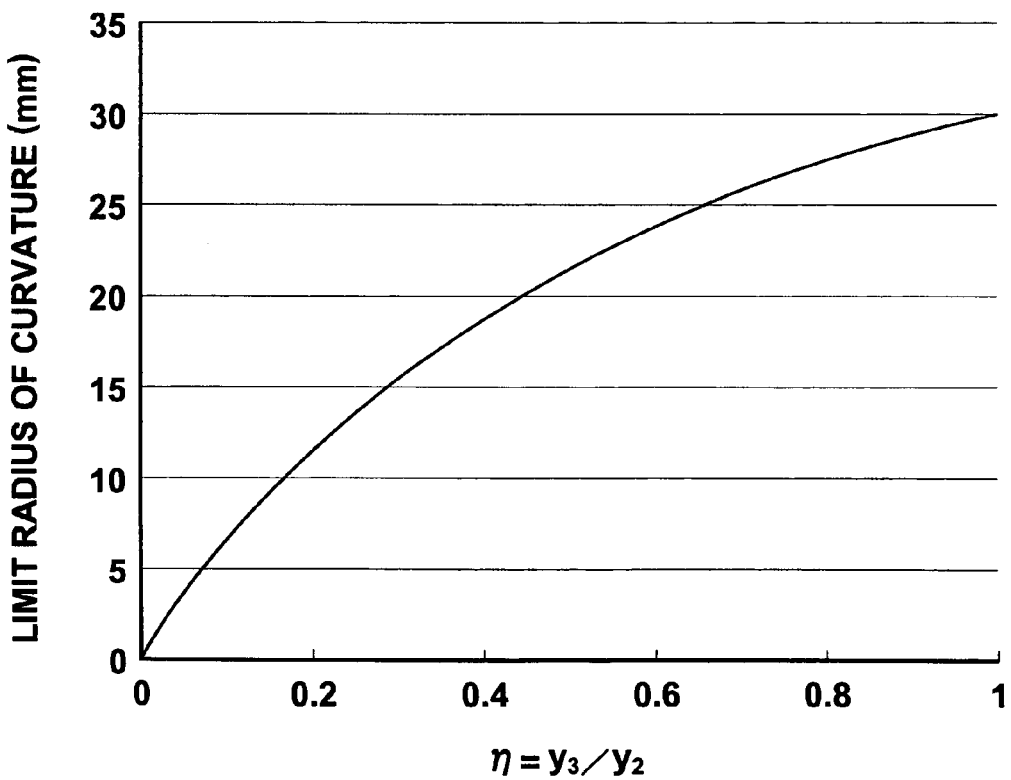
FIG. 8 is a graph showing the relation between the position of the gas barrier layer and the limit radius of curvature of the substrate in the display device.
Figure 9:
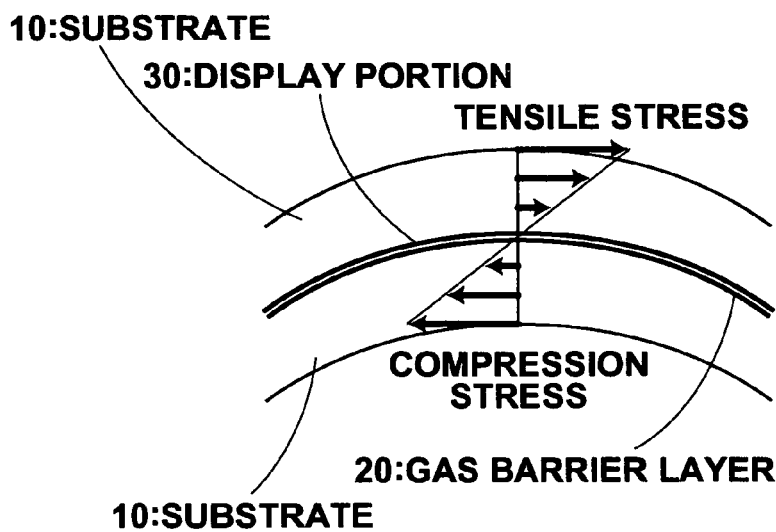
FIG. 9 is a view showing in brief another arrangement of the display device of the present invention.
Figure 10:
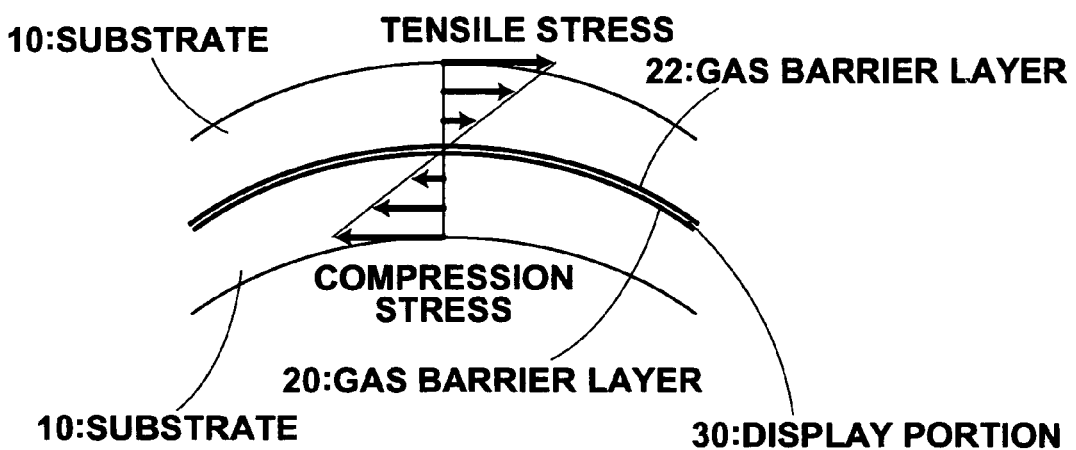
FIG. 10 is a view showing in brief still another arrangement of the display device of the present invention.
Figure 11A:
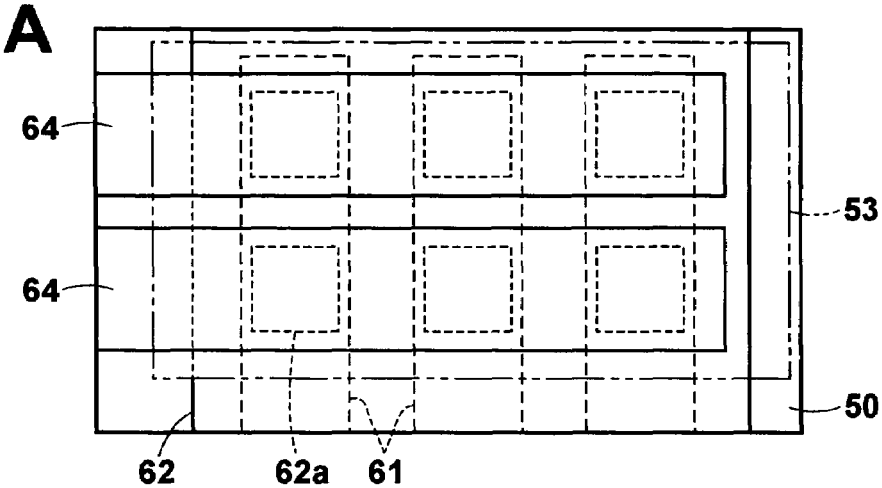
FIGS. 11A and 11B are respectively a plan view and a side view showing in brief an organic EL element in accordance with an embodiment of the present invention.
Figure 11B:
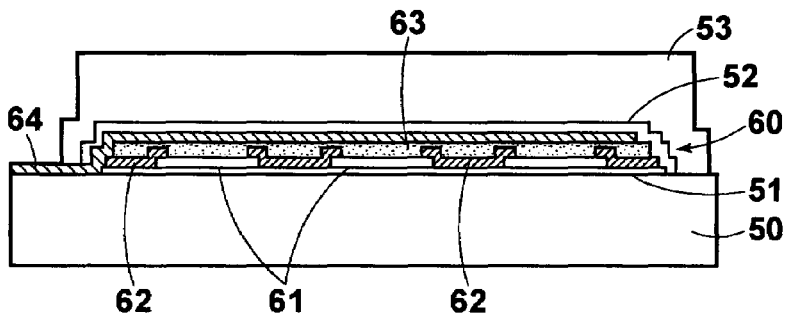

FIGS. 11A and 11B respectively show plan view and a side view of an important part of an organic EL element in accordance with an embodiment of the present invention. As shown in FIGS. 11A and 11B, the organic EL element of this embodiment comprises a lower substrate 50, a display portion 60 formed on the lower substrate 50, an upper substrate 53 as an upper layer covering the display portion 60 and the part above the display portion 60, a first gas barrier layer (sealing film) 51 disposed between the lower substrate 50 and the display portion 60 and a second gas barrier layer (passivation film) 52 disposed between the display portion 60 and the upper substrate 53.

The organic EL element of this embodiment is flexible. For this purpose, the lower and upper substrates 50 and 53 are formed of flexible and transparent resin of, for instance, macromolecular material.

The display portion 60, as in the usual organic EL element, comprises a plurality of transparent anode strips 61 spaced from each other, an insulating film 62 which is formed of, for instance, $SiO_2$ which covers the transparent anode strips 61 from above with predetermined parts of the transparent anode strips 61 exposed through openings 62a, an organic EL layer 63 disposed on the transparent anode strips 61, and a plurality of cathode strips 64 opposed to the exposed parts of the transparent anode strips 61 with the organic EL layer 63 intervening therebetween. The organic EL layer 63, as that of the usual organic EL element, comprises a positive hole transfer layer and a light emitting layer which are of organic compound. If desired, at least one suitable layer such as a positive hole injection layer, an electron injection layer, an electron transfer layer or the like may be added to the organic EL layer 63.

The cathode strips 64 are arranged in a direction perpendicular to the transparent anode strips 61 spaced from each other. With this arrangement, intersections of the transparent anode strips 61 and the cathode strips 64 (here, the transparent anode strip 61 is exposed through the opening 62a of the insulating film 62) are arranged like a two-dimensional matrix, and each of the intersections forms a light emitting portion where the organic EL layer 63 is between the transparent anode strip 61 and the cathode strip 64. When a predetermined electric current flows between the transparent anode strip 61 and the cathode strip 64, a light emitting layer of each of the light emitting portions emits light independently of the other light emitting portions and the light is taken out through the transparent anode strip 61 and the transparent lower substrate 50.

It is preferred that the transparent anode strips 61 exhibit at least not smaller than 50% (preferably, not smaller than 70%) of light-transmittivity to light in a visible light wavelength range of 400 nm to 700 nm. As the material of the transparent anode strips 61, compounds known as the material of the transparent electrode such as tin oxide, indium-tin oxide (ITO) or indium-zinc oxide may be used. However, film of metal such as gold or platinum which is large in work function may be used as the material of the transparent anode strips 61. Further, an organic compound such as polyaniline, polythiophene, polypyrrole or their derivatives may be used as the material of the transparent anode strips 61. Further, "New Stage of Transparent Conductive Film" (supervised by Yutaka Sawada, GMC CO., 1999) has described in detail the transparent conductive film and those disclosed there may be applied to the present invention.

It is preferred that the cathode strips 64 be formed by metal material such as alkaline metal (e.g., Li or K), alkaline earth metal (e.g., Mg or Ca), or alloy or mixture of these metal which is small in work function. So that the can stability and electron injection are compatible with each other on the cathode, the electrode formed by the material described above may be coated with Ag, Al, Au or the like which is large in work function and high in conductivity. The cathode strips 64 as well as the transparent anode strips 61 may be formed by a known method such as vacuum deposition, sputtering, ion plating or the like.

The first gas barrier layer (sealing film) 51 is formed by, for instance, aluminum oxide ($Al_2O_3$), silicon oxide ($SiO_2$) or silicon oxide nitride ($SiO_xN_y$) and has a function of shielding gas and liquid. When such a first gas barrier layer 51 is disposed between the lower substrate 50 and the display portion 60, oxygen or water is prevented from penetrating to the display portion 60 through the lower substrate 50 and deteriorating the display portion 60. The second gas barrier layer (passivation film) 52 is formed by, for instance, silicon nitride ($SiN_x$) and also has a function of shielding gas and liquid. When such a second gas barrier layer 52 is disposed between the upper substrate 53 and the display portion 60, oxygen or water is prevented from penetrating to the display portion 60 through the upper substrate 53 and deteriorating the display portion 60.

The first and second gas barrier layers 51 and 52 and the display portion 60 are disposed near to the position which forms a neutral plane when bending moment in a direction in which the substrates 50 and 53 are warped acts on the overall display device. In such an organic EL element, no or very small tensile stress or compression stress is generated in the gas barrier layers 51 and 52 and the display portion 60 even when the element undergoes external force which warps the substrate, whereby the gas barrier layers 51 and 52 and the display portion 60 are effectively prevented from being damaged whereby the service life of the organic EL element is elongated.

One of the first and second gas barrier layers 51 and 52 and/or the display portion 60 may be remote from the neutral plane. The arrangement where the first gas barrier layer 51 is remote from the neutral plane and the second gas barrier layer 52 is near to the neutral plane is included in the present invention when the upper and lower substrates 53 and 50 are respectively considered to be the substrate and the upper layer as mentioned in the present invention.

Methods of producing an organic EL element of the above arrangement will be described next. The elements other than the upper substrate 53 may be formed on the lower substrate 50 by, for instance, (a) deposition, (b) coating, (c) ink jet or (d) transfer. These method will be described, hereinbelow.

(a) Deposition

Figure 12:
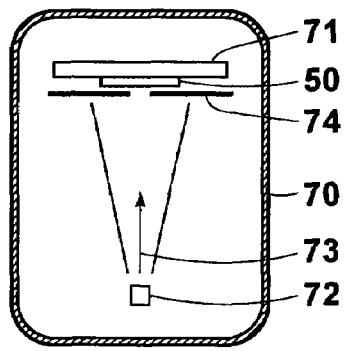
FIG. 12 is a view for illustrating a method of producing a display device in accordance with the present invention.

In this method, as shown in FIG. 12, the lower substrate 50 is held in a vacuum deposition pot 70 by a substrate holding jig 71, and layer material 73 evaporated from a deposition source 72 is deposited on the lower substrate 50 through a mask 74. By carrying out this step a plurality of times with the deposition source 72 and the mask 74 changed, a first gas barrier layer 51 can be formed on the lower substrate 50, the display portion 60 comprising the transparent anode strips 61, the insulating film 62, the organic EL layer 63, the cathode strips 64 and the like can be formed on the first gas barrier layer 51, and the second gas barrier layer 52 can be formed on the display portion 60.

(b) Coating

Figure 13:
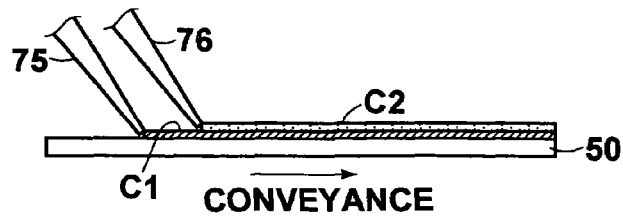
FIG. 13 is a view for illustrating a method of producing a display device in accordance with the present invention.

In this method, as shown in FIG. 13, while the lower substrate 50 is conveyed in one direction, coating solution is blown on the lower substrate 50 through, for instance, a plurality of nozzles 75 and 76, whereby coating layers C1 and C2 which form the first gas barrier layer 51, the display portion 60, the second gas barrier layer 52, and the like are formed. By controlling blowing of the coating solution through the nozzles 75 and 76, the coating layers C1 and C2 can be formed in desired patterns. Further, by using a plurality of nozzles 75 and 76, a plurality of coating layers can be formed at one time, for example, the coating layer C2 is formed on the coating layer C1.

(c) Ink Jet

Figure 14A:
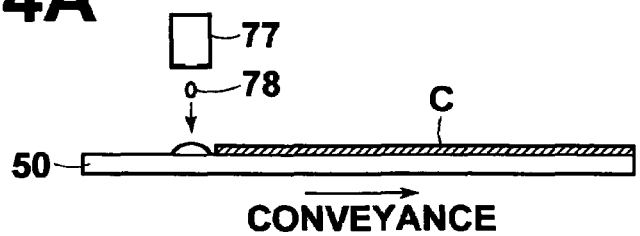
FIGS. 14A and 14B are views for illustrating a method of producing a display device in accordance with the present invention.
Figure 14B:
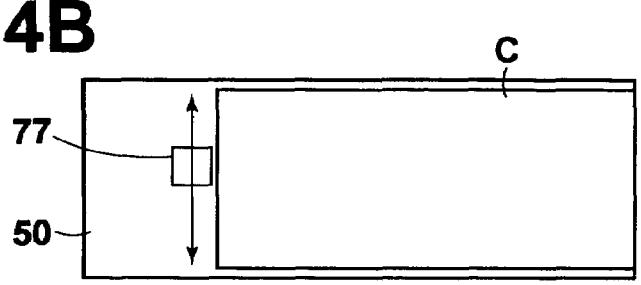

FIGS. 14A and 14B are, respectively, a side view and a plan view showing a state of forming a coating layer C which forms the first gas barrier layer 51, the display portion 60, the second gas barrier layer 52 or the like. While the lower substrate 50 is conveyed in one direction, a droplet 78 is blown on the lower substrate 50 from the ink jet head 77. By causing the ink jet head 77 to scan the lower substrate 50 in a direction intersecting the direction on which the lower substrate 50 is conveyed and controlling blowing of the droplet 78 from the ink jet head 77, the coating layer C can be formed in a desired pattern. By carrying out this step a plurality of times, a plurality of coating layers forming the first gas barrier layer 51, the display portion 60 and the second gas barrier layer 52 can be formed in sequence.

(d) Transfer

Figure 15A:
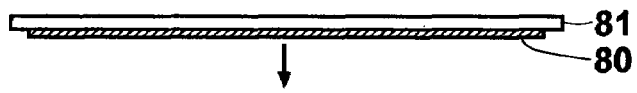
FIGS. 15A to 15C are views for illustrating a method of producing a display device in accordance with the present invention.
Figure 15B:
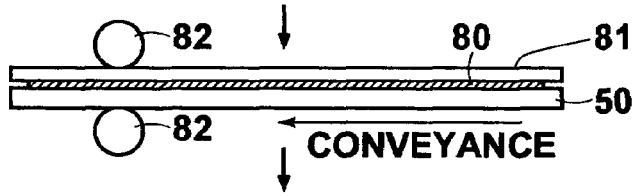
Figure 15C:
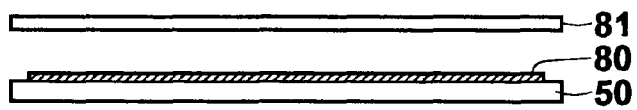

In this method, as shown in FIG. 15A, a transfer sheet 81 on which a transfer layer 80 comprising the first gas barrier layer 51, the display portion 60 and the second gas barrier layer 52 (FIG. 11) are formed on one side thereof is prepared and the transfer sheet 81 is brought into contact with the lower substrate 50 with the transfer layer 80 facing the lower substrate 50. Then the transfer sheet 81 and the lower substrate 50 are passed between the press/transfer rollers 82 (a pair of nip rollers) to be pressed against each other as shown in FIG. 15B, whereby the transfer layer 80 is transferred to the lower substrate 50 and the first gas barrier layer 51, the display portion 60 and the second gas barrier layer 52 are formed on the lower substrate 50 as shown in FIG. 15C.

When dense inorganic film is formed as the first gas barrier layer (sealing film) 51 or the second gas barrier layer (passivation film) 52, the deposition is especially suitable. Whereas, when organic film such as of plastic or the like is formed as the first or second gas barrier layer 51 or 52, not only the deposition but also all the methods described above may be suitably used.

Methods of producing the upper substrate 53 shown in FIG. 11 will be described next.

(A) Coating

Figure 16:
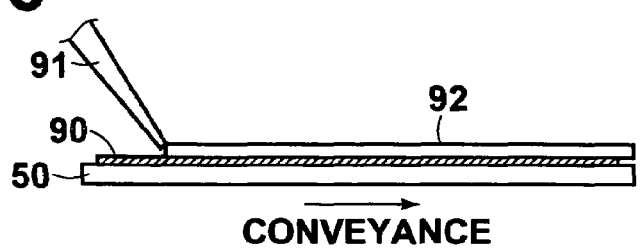
FIG. 16 is a view for illustrating a method of producing a display device in accordance with the present invention.

As shown in FIG. 16, a lower substrate 50 on which the first gas barrier layer 51, the display portion 60 and the second gas barrier layer 52 (See FIG. 11. In the following description, these elements altogether will be referred to as "the laminated film 90".) have been formed by one of the above described methods is prepared. While the lower substrate 50 is conveyed in one direction, coating solution is blown on the lower substrate 50 through a nozzle 91 to form a coating film 92 on the laminated film 90. By drying and solidifying the coating film 92, the upper substrate 53 shown in FIG. 11 is formed.

(B) Lamination

As shown in FIG. 17A, a lower substrate 50 on which the laminated film 90 has been formed by one of the above described methods is prepared. Then the lower substrate 50 is brought into contact with an adhesive layer 94 formed on one surface of the upper substrate 53. Then the lower and upper substrates 50 and 53 are passed between the press/transfer rollers 82 (a pair of nip rollers) to be pressed against each other as shown in FIG. 17B, whereby the upper substrate 53 is integrated with the laminated film 90 on the lower substrate 50.

Though organic EL elements in accordance with embodiments of the present invention have been described, the present invention can be applied to any one of other display devices such as a liquid crystal display device, a cataphoretic display device, or an inorganic EL element so long as it is provided with a gas barrier layer. Also in this case, the effect similar to those described above can be expected.

What is claimed is:

1. A display device comprising a substrate, a display portion formed on the substrate, an upper layer which covers the display portion, and a gas barrier layer provided between at least a part of the substrate and the display portion, wherein the improvement comprises that
    the gas barrier layer is positioned near to a position which forms a neutral plane when bending moment in a direction in which the substrate is warped acts on the display device.

2. A display device as defined in claim 1 in which a distance between the neutral plane and the gas barrier layer is not larger than 30% of a distance between the neutral plane and a surface of the substrate on a side of the gas barrier layer.

3. A display device as defined in claim 2 in which the display portion is positioned near to the position which forms the neutral plane.

4. A display device as defined in claim 3 in which a distance between the neutral plane and the display portion is not larger than 30% of a distance between the neutral plane and a surface of the substrate on a side of the display portion.

5. A display device as defined in claim 1 in which the upper layer is formed of a same material as the substrate.

6. A display device as defined in claim 5 in which a distance between the neutral plane and the gas barrier layer is not larger than 30% of a distance between the neutral plane and a surface of the substrate on a side of the gas barrier layer.

7. A display device as defined in claim 6 in which the display portion is positioned near to the position which forms the neutral plane.

8. A display device as defined in claim 7 in which a distance between the neutral plane and the display portion is not larger than 30% of the distance between the neutral plane and the surface of the substrate on a side of the display portion.

9. A display device as defined in claim 5 in which the display portion is positioned near to the position which forms the neutral plane.

10. A display device as defined in claim 9 in which 5 a distance between the neutral plane and the display portion is not larger than 30% of a distance between the neutral plane and a surface of the substrate on a side of the display portion.

11. A display device as defined in claim 1 in which the display portion is positioned near to the position which forms the neutral plane.

12. A display device as defined in claim 11 in which a distance between the neutral plane and the display portion is not larger than 30% of a distance between the neutral plane and a surface of the substrate on a side of the display portion.

13. A display device as defined in claim 1 in which the gas barrier layer includes at least one of aluminum oxide ($Al_2O_3$), silicon oxide ($SiO_2$) and silicon oxide nitride ($SiO_xN_y$).

14. A display device as defined in claim 1 in which a second gas barrier layer is formed on a side of the display device opposite to the substrate, and the second gas barrier layer is positioned near to the position which forms the neutral plane.

15. A display device as defined in claim 14 in which the second gas barrier layer includes at least silicon nitride ($SiN_x$).

16. A display device as defined in claim 1 in which the substrate is a resin substrate formed of macromolecular material.

17. A display device as defined in claim 1 in which the display device comprises an organic EL element.

18. A display device as defined in claim 1, wherein $E_1 * Y_1^2$ substantially equals to $E_2 * Y_2^2$, where $E_1$ and $E_2$ are moduli of longitudinal elasticity of the upper layer and the substrate, respectively; $Y_1$ is a distances between the gas barrier layer and a surface of the upper layer on an opposite side of the gas barrier; and $Y_2$ is a distances between the gas barrier layer and a surface of the substrate on an opposite side of the gas barrier.

19. A display device as defined in claim 1, wherein the display portion is positioned substantially close to the neutral plane without overlapping the neutral plane.

* * * * *